United States Patent [19]

Heinecke

[11] Patent Number: 4,773,868

[45] Date of Patent: Sep. 27, 1988

[54] APPARATUS FOR USE WITH STACKABLE PROCESSOR MODULES

[75] Inventor: Wolfgang Heinecke, Weinheim, Fed. Rep. of Germany

[73] Assignee: Chemie und Filter GmbH, Heidelberg, Fed. Rep. of Germany

[21] Appl. No.: 27,331

[22] Filed: Mar. 18, 1987

[30] Foreign Application Priority Data

Mar. 19, 1986 [DE] Fed. Rep. of Germany ....... 3609170

[51] Int. Cl.$^4$ .......................... H01R 9/09; H05K 1/14
[52] U.S. Cl. ......................................... 439/69; 361/393
[58] Field of Search ............................... 361/392–396; 439/68–70

[56] References Cited

U.S. PATENT DOCUMENTS 3,234,433 2/1966 Braunagel ........................... 361/393

FOREIGN PATENT DOCUMENTS 1059988 6/1959 Fed. Rep. of Germany .
1279148 10/1968 Fed. Rep. of Germany .
1283173 7/1972 United Kingdom .

OTHER PUBLICATIONS

National Semiconductor Corp., brochure, MA2000 Macrocomponent Family, IBM Bulletin, Falda, vol. 23, No. 12, p. 5410, 5-1981.

Primary Examiner—Neil Abrams
Attorney, Agent, or Firm—Peter K. Kontler

[57] ABSTRACT

An apparatus for use with stackable processor modules to form an electrical device such as a microcomputer comprises superimposed stacked main or processor modules with one group of connectors which have connector pins at one side of the module and sockets at the other side of the module. At least one intermediate module is provided with two groups of angularly offset connectors, each of which corresponds to the group of connectors of a process or module. When assembled into a stack, two processor modules neighboring an intermediate module are angularly offset relative to each other and are connected to different connector groups of the intermediate module. In this manner, it is possible to assemble stacks of modules with different isolated bus sections that are not directly connected to each other.

10 Claims, 1 Drawing Sheet

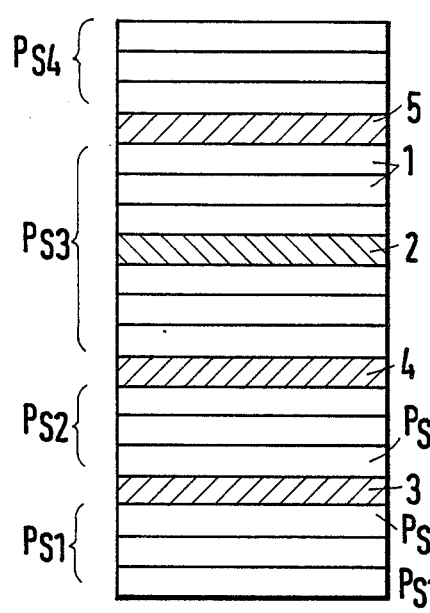
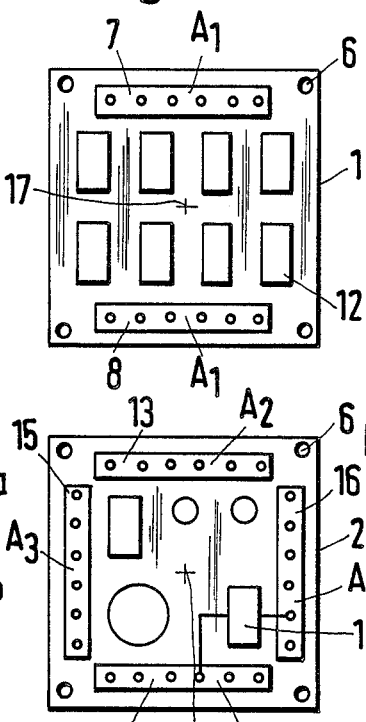
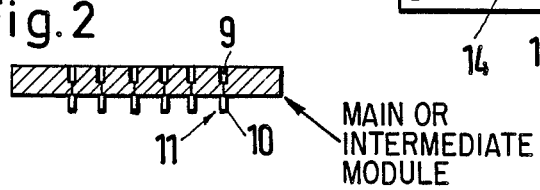
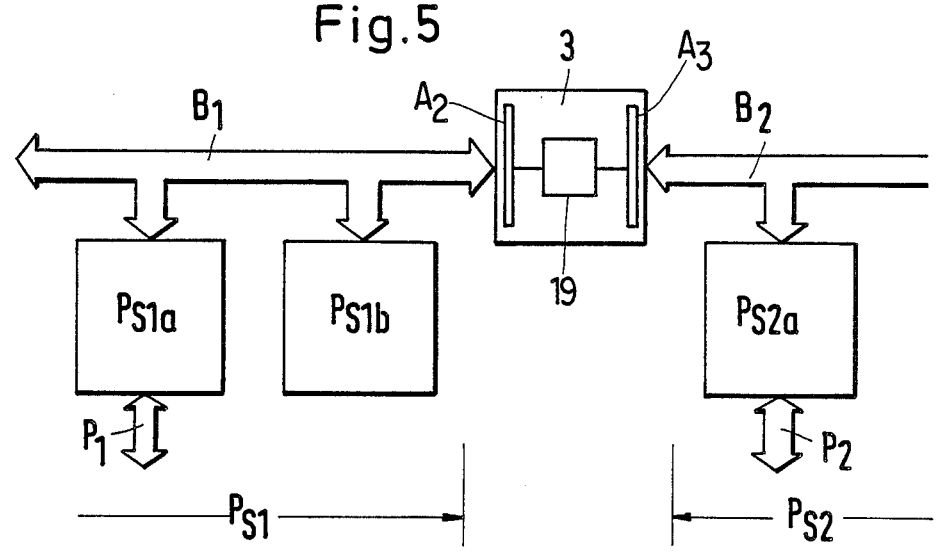

APPARATUS FOR USE WITH STACKABLE PROCESSOR MODULES

FIELD OF THE INVENTION

This invention relates to microcomputer devices formed with stackable processor modules. More specifically, this invention relates to modules for use with stackable processor modules that interfit with connectors using male connector pins on one side of the module and female connector sockets on the other side of the module.

BACKGROUND OF THE INVENTION

Processor or main modules are known and are distributed, for example, by the National Semiconductor Corporation under the family designation MA2000. The processor modules are of different types such as microcomputer modules, memory modules, analog modules and the like. Each processor module comprises a circuit board or plate which is provided with integrated and printed circuits as well as other components. The electrical and mechanical connections between the processor modules are established by way of pluggable bus-coupled connections. Such connections typically employ two connectors mounted adjacent longitudinal edges of rectangular processor modules. Peripheral connections formed with laterally projecting connectors can be provided along narrow sides of the processor modules.

The above-described design of processor modules renders it possible to assemble a wide variety of electrical devices from a limited number of modules. The connectors between neighboring modules form a continuous bus of conductors such as for data transmission, control, power supply and other functions. There is no need to provide a separate bus. However, such design is suitable only for modules which need to be connected to the same bus.

SUMMARY OF THE INVENTION

It is an object of the invention to enable a plurality of processor modules to be stacked to form an electronic apparatus wherein different bus sections can be formed for connection to different processor modules in the stack.

This is achieved by using an intermediate module on which at least first and second connections are mounted with male and female parts that interfit with bus-coupled connectors on the processor modules. The connectors on intermediate modules are separated from each other so as to provide separate bus sections between processor modules.

As described herein, for a stack of processor modules in accordance with one form of the invention, an intermediate module is provided with two connector groups, each of which corresponds to the connector group of a processor module. The two connector groups are so located, relative to each other, that neighboring processor modules (which are separated from each other by the intermediate module) can be a part of the stack but have separate bus sections merely by imparting an angular offset relative to an intermediate module.

The intermediate module renders it possible to provide for example, two stack portions which are physically connected to each other by pluggable connectors but wherein the bus sections of the stack portions are separate and not immediately adjacent one another. Use of the intermediate module merely requires that a connector used on the neighboring main or processor modules be associated with a different connector on the intermediate module. Selected individual bus conductors in the intermediate module, such as the power supplying conductors of different connectors on the intermediate module, can be connected to each other while the other conductors can remain electrically separated. However, it is also possible to connect selected or corresponding conductors in the connectors with each other by way of interposed circuit elements that are mounted on the intermediate module.

The creation of separate bus sections in a common stack is advantageously achieved by physically off-setting the processor module relative to the intermediate module with an angular rotation. In such case, different connectors on the intermediate module are spaced apart and are aligned along different directions. The connectors on the intermediate module are located at different surface areas in such a manner that the center of each module is substantially kept at the center of the stack independent of the angular rotation of one or a group of processor modules. This results in the assembly of a more stable stack.

The peripheries of the processor and intermediate modules preferably have a shape which enable registration with one another upon rotation through the offset angle. This can be achieved by use of a symmetrical peripheral shape about the central axis. In this manner, a stack with a substantially uniform external surface is obtained even if it is necessary to employ stack sections, of individual modules or stacks of modules, which have been angularly offset relative to each other.

The peripheral shapes of the modules can be circular, or square. Square modules can be turned relative to each other in increments of 90 degrees, 180 degrees (in the case of single instead of pairs of connectors), or 270 degrees. Other shapes can be used.

In accordance with a preferred embodiment of the invention, each connector group on the processor modules consists of two rows of connectors which are disposed along opposite edges of the module. Correspondingly, the intermediate modules each have a connector located adjacent an edge. This renders it possible to provide a large number of connectors not unlike a bus with a large number of conductors.

The intermediate modules can be designed in a number of different ways. In a preferred form, the intermediate module has signal amplifiers to amplify the signals originating from one connector group for transmission to the other group of connectors or vice versa. In this manner, it is possible to amplify bus conductor signals. Such bus amplifier can be advantageous when the system employs a large number of interconnected processor modules and an overload of signal sources needs to be avoided.

Another advantage is that the intermediate module can function as a separator module which memorizes signals transmitted thereto from one connector group and transmits the memorized signals to another connector group in response to address signals. Such bus separators can be used when several microprocessors in an overall system should be simultaneously active with a partial exchange of data. Such multiple-processor systems are needed, for example, when a manipulating apparatus (robot) is to perform simultaneous movements in several directions.

These and other objects and advantages of the invention can be understood from the following detailed description made with reference to a preferred embodiment as shown in the drawings.

BRIEF DESCRIPTION OF DRAWINGS

FIG. 1 is a schematic front elevational view of an electronic apparatus which embodies the invention;

FIG. 2 is a sectional view of a row of connectors in a module;

FIG. 3 is a plan view of a main module;

FIG. 4 is a plan view of an intermediate module; and

FIG. 5 is a blcok diagram of a portion of the apparatus.

DETAILED DESCRIPTION OF DRAWINGS

FIG. 1 shows an electronic apparatus which is assembled of a substantial number of stacked processor modules 1, an intermediate amplifier module 2 and three intermediate separator modules 3, 4 and 5. The three lowermost processor modules constitute an autarchic processor system PS1 which is separated from a second autarchic processor system PS2 of three main modules by the intermediate separator module 3. Above PS2 is the intermediate separator module 4 and an autarchic processor system PS3 which consists of six processor or main modules and the intermediate amplifier module 2. The PS3 system is disposed below the intermediate separator module 5 which, in turn, is disposed below a further autarchic processor system PS4 with three processor or main modules. For example, the processor system PS1 can consist of a CPU-module, a memory module and an analog module with inputs and outputs for peripherals. Each of the processor modules comprises a customary plate or circuit board for electronic components. They perform various functions of process control, regulation and data processing.

As shown in FIGS. 3 and 4, each of the processor or main modules 1, as well as the intermediate module 2, has a square outline. Each module 1 comprises two rows, 7 and 8, of spaced-apart parallel oriented connectors which extend along two opposed and parallel edges. The two rows 7 and 8 of connectors together form a connector group A1. As illustrated in FIG. 2, each connector has a female part formed of sockets 9 at its upper side and at its underside a male part formed of connector pins 10. The sockets 9 and pins 10 are connected to each other in pairs to form terminals 11. These terminals 11 constitute conductor sections of a processor bus which is associated with the respective module. For example, the processor bus can contain data, addressing, control, regulating, current-supplying and other conductors. In actual practice, the number of terminals 11 is much larger than as shown in FIG. 2 and can total 48, for example. If necessary, the terminals 11 are properly connected with components 12 on the plate or circuit board.

The intermediate module 2 comprises a total of four connector rows 13, 14, 15 and 16. The connectors 13 and 14 together form a second connector group A2, and the connectors 15 and 16 together form a third connector group A3. The connectors of the groups A2 and A3 are designed as in FIG. 2. The connector pins 10 of the connector group A1 of the processor module 1 can be inserted into the sockets 9 of the connector group A2 of the intermediate module or, after an angular displacement through 90 degrees with reference to the axis of rotation 17, into the sockets 9 of the connector group A3. Thus, the two connector groups A2 and A3 correspond to the connector group A1 and are merely offset therefrom by an angle of rotation of 90 degrees.

The modules of the processor systems PS1 and PS4 as well as the three lower processor modules of the processor system PS3 in the apparatus of FIG. 1 have the same orientation as in FIG. 3. The main or processor modules of the processor system PS2 and the three upper modules of the processor system PS3 are angularly offset by 90 degrees. Consequently, the bus sections of the processor system PS2 are no longer connected with the bus sections of the processor system PS1, and a connection between them can only be established by way of other paths and switching elements as may for example be provided in the intermediate separator module. The same applies for the upper mutually-offset processor modules.

Switching elements 18 are provided on the plate or board 2 of FIG. 4 and are designed in such a way that they establish an amplifying connection between at least some connectors of the connector groups A2 and A3.

FIG. 5 shows schematically that the modules PS1a and PS2a can have peripheral connectors P1 and P2, respectively, which constitute inputs or outputs for data or control signals. The terminals of the corresponding module constitute a processor bus B1 for the processor system PS1 and a processor bus B2 for the processor system PS2. The processor bus B1 is connected with the processor bus B2 by way of the intermediate separator module 3. For example, the intermediate module 3 can comprise a memory 17 which can receive signals by way of the connector group A2. The following processor system PS2 can address this memory by way of the connector group A3. This mode of operation corresponds to the conventional mailbox system.

It is possible to depart from the illustrated embodiment in a number of ways without departing from the spirit and scope of the invention. For example, the terminals 11 can be concentrated along one edge of the module. In such instance, the angle of offset of 90 degrees can be replaced with an angle of 180 degrees. The plates can have a circular outline. All in all, one can assemble novel electronic apparatus in the form of stacks. It is of particular interest and advantage that one can assemble several simultaneously operating processor systems into a single stack. The affixing and registered holes 6 render it possible to mechanically reinforce the stack and to secure it in a housing by means of distancing bolts, threaded tie rods or other mechanical elements.

What is claimed is:

1. An electronic processing apparatus, comprising a first processing module having a first group of electrical connectors; a second processing module having a second group of electrical connectors arrayed in the same pattern as the connectors of said first group; and an intermediate module having two additional groups of electrical connectors, the connectors of each of said additional groups being arrayed in the same pattern as the connectors of said first and second groups, and said additional groups being displaced relative to one another, said intermediate module being disposed between said first and second modules, and said first and second modules being displaced relative to one another in the same manner as said additional groups and being arranged so that said first group engaged one of said additional groups while said second group engages the other of said additional groups, said first group and said one additional group together establishing the sole electrical connections between said first and intermediate modules, and said second group and said other additional group together establishing the sole electrical connections between said second and intermediate modules.

2. The apparatus of claim 1, wherein each of said connectors comprises a male part and a female part.

3. The apparatus of claim 1, wherein said additional groups are angularly displaced relative to one another, said intermediate module including a circuit element which is interposed between said additional groups.

4. The apparatus of claim 1, wherein said additional groups are angularly displaced relative to one another about a predetermined rotational axis and are located radially outwardly of said axis, the displacement angle being selected in such a manner that each of said additional groups occupies a different surface area of said intermediate module.

5. The apparatus of claim 1, wherein said additional groups are angularly displaced relative to one another by a predetermined angle and the periphery of each module has a shape such that, upon rotation of the module through said predetermined angle, the orientation of the periphery is unchanged.

6. The apparatus of claim 1, wherein said additional groups are angularly displaced relative to one another by a predetermined angle and each module is provided with a plurality of mounting holes arranged such that, upon rotation of the module through said predetermined angle, one of the holes moves into the position previously occupied by another of the holes.

7. The apparatus of claim 1, wherein said additional groups are angularly displaced relative to one another by substantially 90° and each module is substantially square.

8. The apparatus of claim 7, wherein each of said modules has two pairs of opposed marginal portions and each of said groups includes two rows of connectors, one row of each group extending along one marginal portion of a pair and the other row of each group extending along the other marginal portion of the pair.

9. The apparatus of claim 1, wherein one of said additional groups constitutes an input and the other of said additional groups constitutes an output, said intermediate module including an amplifier which is interposed between said additional groups.

10. The apparatus of claim 1, wherein one of said additional groups constitutes an input and the other of said additional groups constitutes an output, said intermediate module including a memory which is interposed between said groups.

* * * * *